US010266949B2

(12) United States Patent
Biener et al.

(10) Patent No.: US 10,266,949 B2
(45) Date of Patent: Apr. 23, 2019

(54) ACTUATION VIA SURFACE CHEMISTRY INDUCED SURFACE STRESS

(75) Inventors: Juergen Biener, San Leandro, CA (US); Monika M. Biener, San Leandro, CA (US); Alex V. Hamza, Livermore, CA (US); Marcus Baeumer, Bremen (DE); Arne Wittstock, Bremen (DE); Joerg Weissmueller, Stutensee (DE); Dominik Kramer, Eggenstein-Leopoldshafen (DE); Raghavan Nadar Viswanath, Eggenstein-Leopoldshafen (DE)

(73) Assignee: Lawrence Livermore National Security, LLC, Livermore, CA (US)

( * ) Notice: Subject to any disclaimer, the term of this patent is extended or adjusted under 35 U.S.C. 154(b) by 2221 days.

(21) Appl. No.: 12/249,630

(22) Filed: Oct. 10, 2008

(65) Prior Publication Data

US 2009/0101241 A1 Apr. 23, 2009

Related U.S. Application Data

(60) Provisional application No. 60/980,111, filed on Oct. 15, 2007.

(51) Int. Cl.

| | |
|---|---|
| ***C23C 8/06*** | (2006.01) |
| ***G01L 1/20*** | (2006.01) |
| ***C23F 1/00*** | (2006.01) |
| *G01N 27/403* | (2006.01) |
| *H01L 41/047* | (2006.01) |

(52) U.S. Cl.

CPC ............ *C23F 1/00* (2013.01); *F05D 2230/25* (2013.01); *F05D 2300/133* (2013.01)

(58) Field of Classification Search

CPC ................ C23C 8/06; G01L 1/20; C23F 1/00

See application file for complete search history.

(56) References Cited

U.S. PATENT DOCUMENTS

| | | | | |
|---|---|---|---|---|
| 3,803,043 | A * | 4/1974 | Magladry et al. | 252/625 |
| 4,922,641 | A | 5/1990 | Johnson | 42/74 |

(Continued)

FOREIGN PATENT DOCUMENTS

| | | | | |
|---|---|---|---|---|
| WO | 2007/103832 A2 | 9/2007 | | F02B 15/00 |
| WO | 2007/103832 A3 | 9/2007 | | F02C 1/100 |

OTHER PUBLICATIONS

Coordination-Dependent Surface Atomic Contraction in Nanocrystals Revealed by Coherent Diffraction, W.J. Huang et al., Nature Materials, vol. 7, published online: Mar. 9, 2008.*

(Continued)

*Primary Examiner* — Lois L Zheng

(74) *Attorney, Agent, or Firm* — Zilka-Kotab

(57) ABSTRACT

A method of controlling macroscopic strain of a porous structure includes contacting a porous structure with a modifying agent which chemically adsorbs to a surface of the porous structure and modifies an existing surface stress of the porous structure. A device in one embodiment includes a porous metal structure, which when contacted with a modifying agent which chemically adsorbs to a surface of the porous metal structure, exhibits a volumetric change due to modification of an existing surface stress of the porous metal structure; and a mechanism for detecting the volumetric change. Additional methods and systems are also presented.

19 Claims, 3 Drawing Sheets

(56) References Cited

U.S. PATENT DOCUMENTS

| | | | | |
|---|---|---|---|---|
| 4,977,038 | A * | 12/1990 | Sieradzki et al. | 428/610 |
| 6,255,009 | B1 | 7/2001 | Rusek et al. | 429/13 |
| 6,446,909 | B1 | 9/2002 | Michelson | 244/72 |
| 6,555,945 | B1 * | 4/2003 | Baughman | F03G 7/005 136/291 |
| 2004/0040416 | A1 * | 3/2004 | Erlebacher et al. | 75/345 |
| 2004/0137296 | A1 | 7/2004 | Schunk et al. | 429/30 |
| 2005/0006640 | A1 | 1/2005 | Jackson et al. | 257/40 |
| 2005/0028901 | A1 | 2/2005 | Howard | 148/563 |

OTHER PUBLICATIONS

Erlebacher J, Aziz MJ, Karma A. et al., "Evolution of nanoporosiry in dealloying" Nature 410 (6827): 450-453 Mar. 22 2001.

Saliba N, Parker DH, Kocl BE, "Adsorption of oxygen on Au(111) by exposure to ozone" Surface Science 410 (2-3): 270-282 Aug. 1, 1998.

Zielasek V, Juergens B, Schulz C, Biener J, Biener MM, Hamza AV, Baumer M, "Gold Catalysts: Nanoporous gold foams" Angewandte Chemie—International Edition 45 (48): 8241-8244 2006.

Kramer D. Viswanath RN, Weissmuller J. "Surface-stress induced macroscopic bending of nanoporous gold cantilevers" Nano Letters 4 (5): 793-796 May 2004.

Torres D., Neyman K.M., Illas F., "Oxygen atoms on the (111) surface of coinage metals: On the chemical state of the adsorbate" Chem. Phys. Lett 429 (2006) 86.

Baughman, R.H.; Muscles made from Metal Science, American Association for the Advancement of Science, US, Washington, DC, vol. 300, Apr. 11, 2003; p. 268-269.

Weissmuller J. et al., "Charge-induced reversible strain in a metal" Science, American Association for the Advancement of Science, US, Washington, DC, vol. 300, Apr. 11, 2003; p. 312-315.

Oura et al., "Surface Science An Introduction," Physics and Astronomy Online Library, 2003, 443 pages.

Hudson, J., "Surface Science an Introduction," Rensselaer Polytechnic Institute, 1992, pp. 1-170.

* cited by examiner

ACTUATION VIA SURFACE CHEMISTRY INDUCED SURFACE STRESS

RELATED APPLICATIONS

This application claims priority to provisional U.S. application Ser. No. 60/980,111 filed on Oct. 15, 2007, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to surface chemistry induced macroscopic strain effects of nanoporous metal structures, and more particularly to the control of macroscopic strain of nanoporous gold through reversible, surface chemistry induced changes of the surface stress.

BACKGROUND

Reversible macroscopic dimensional changes (strain) of nanoporous metals such as nanoporous gold or nanoporous platinum can be achieved in an electrochemical environment by controlling the surface stress via the surface electronic charge density which in turn can be controlled by applying an electrical potential.

It would be desirable to achieve macroscopic strain effects in nanoporous metals by using reversible surface-chemistry-driven changes of the surface stress rather than by application of an electrical current in an electrochemical environment. Here, the surface stress of nanoporous metals would be controlled by surface chemistry induced changes of the surface electronic structure rather than by an externally applied potential. This would allow one to directly convert chemical energy into mechanical energy without generating heat or electricity first.

SUMMARY

A method of controlling macroscopic strain of a porous structure is provided. The method includes contacting a porous structure with a modifying agent which chemically adsorbs to a surface of the porous structure and modifies an existing surface stress of the porous structure.

A method of controlling macroscopic strain of a porous metal structure according to another embodiment includes contacting a porous metal structure with a removing agent for removing a chemically adsorbed modifying agent from the porous metal structure, thereby causing a recovery of about dimensions of the porous metal structure prior to adsorption of the modifying agent.

A method of controlling macroscopic strain of a porous metal structure according to yet another embodiment includes contacting a porous metal structure with a modifying agent which chemically adsorbs to a surface of the porous metal structure and modifies an existing surface stress of the porous metal structure, thereby causing an at least partially reversible volumetric change of the nanoporous metal structure; and contacting the porous metal structure with a removing agent for removing a chemically adsorbed modifying agent from the porous metal structure, thereby causing an at least partial recovery of about dimensions of the porous metal structure prior to adsorption of the modifying agent.

A device according to one embodiment includes a porous metal structure, which when contacted with a modifying agent which chemically adsorbs to a surface of the porous metal structure, exhibits a volumetric change due to modification of an existing surface stress of the porous metal structure; and a mechanism for detecting the volumetric change.

Other aspects and embodiments of the present invention will become apparent from the following detailed description, which, when taken in conjunction with the drawings, illustrate by way of example the principles of the invention.

DETAILED DESCRIPTION

Figure 1:
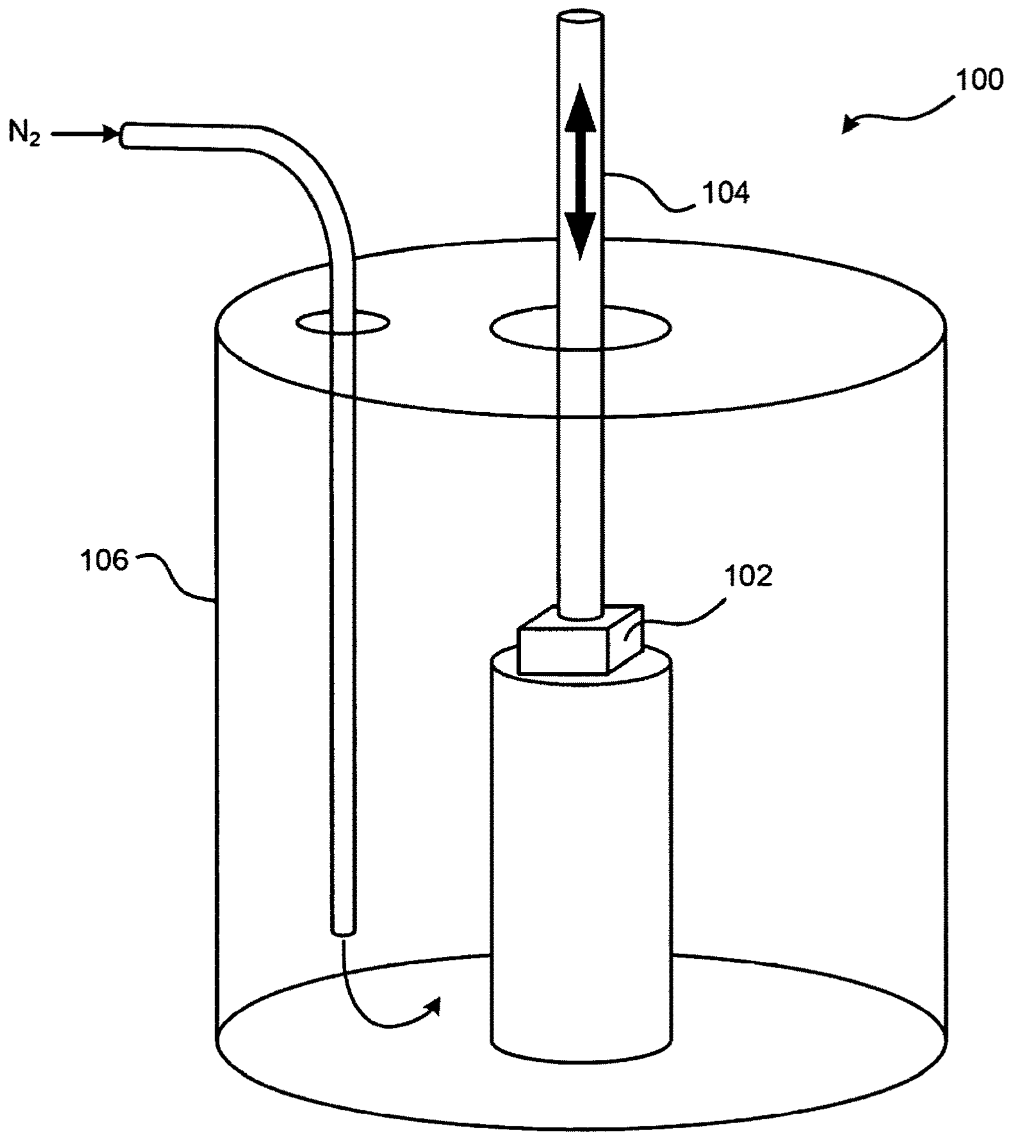
FIG. 1 is a schematic diagram of an experimental setup which can measure the macroscopic strain in samples using a dilameter according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

A method of controlling macroscopic strain of a porous metal structure in one general embodiment includes contacting a porous metal structure with a modifying agent which chemically adsorbs to a surface of the porous metal structure and modifies an existing surface stress of the porous metal structure.

A method of controlling macroscopic strain of a porous metal structure in another general embodiment includes contacting a porous metal structure with a removing agent for removing a chemically adsorbed modifying agent from the porous metal structure, thereby causing a recovery of about original dimensions of the porous metal structure prior to adsorption of the modifying agent.

A method of controlling macroscopic strain of a porous metal structure in another general embodiment includes contacting a porous metal structure with a modifying agent which chemically adsorbs to a surface of the porous metal structure and modifies an existing surface stress of the porous metal structure, thereby causing an at least partially reversible volumetric change (reduction or increase, contraction or expansion) of the nanoporous metal structure; and contacting the porous metal structure with a removing agent for removing a chemically adsorbed modifying agent from the porous metal structure, thereby causing an at least partial recovery of about dimensions of the porous metal structure prior to adsorption of the modifying agent.

A device in a general embodiment includes a porous metal structure, which when contacted with a modifying agent which chemically adsorbs to a surface of the porous metal structure, exhibits a volumetric change (contraction or expansion) due to modification of an existing surface stress of the porous metal structure; and a mechanism for detecting the volumetric change.

Gas-adsorption on the internal surfaces of a nanoporous metal such as gold (Au) can lead to the development of macroscopic strain. Similar to muscles in biological systems, this effect can be used to convert chemical energy directly into mechanical work, and thus opens the door to a new class of surface-chemistry driven actuators and sensors. While not wishing to be bound by any particular theory, this effect is believed to be caused by a modification of the surface stress by adsorption of strongly interacting gas species in combination with a high surface-to-volume ratio of the nanoporous metal. It is believed that adsorbate-induced changes of the surface stress are the consequence of adsorbate-induced changes of the surface electronic structure. For example, it has been observed that ozone exposure of gold surfaces at room temperature leads to the adsorption of atomic oxygen (due to the inertness of gold, molecular oxygen does not chemisorb on gold surfaces). It is also believed that oxygen adsorption on gold leads to a charge transfer from gold to oxygen (the Pauli electronegativity of gold is 2.54, whereas oxygen has a value of 3.44). When applied to high surface-to-volume ratio material such as nanoporous gold, it is believed that this charge redistribution modifies the surface stress of the structure, leading to deformation thereof. The oxygen adsorbed to the gold surface is very reactive and can be removed at room temperature by carbon monoxide exposure leading to the formation of carbon dioxide.

The following surface reactions were studied in relation to this invention: I) room temperature ozone exposure leading to chemisorption of oxygen which causes a macroscopic shrinkage of nanoporous gold of up to about 1.0%, 2) removal of chemisorbed oxygen by room-temperature carbon monoxide (CO) oxidation which substantially restores the original sample dimensions. The effect may be utilized, for example, to design chemically-driven actuators and sensors, as well as to convert chemical energy directly into mechanical work.

The effect is not limited to nanoporous Au, but is a general property of nanoporous materials (including nanoporous metals) with a high surface-to-volume ratio where the interaction of surface atoms with gas phase species leads to a modification of the surface stress of the system. Materials with a very high ratio ($\geq 10^{-3}$ general ratio) of surface atoms to bulk atoms may have more observable macroscopic dimensional changes, and thus are more usable for actuation, sensing, or direct conversion of chemical energy into mechanical energy.

In the most general definition, an actuator is a device which converts some sort of energy into mechanical work. In particular, nanoporous Pt and Au have been demonstrated to yield strain amplitudes comparable to those of commercial ferroelectric ceramics. Although the microscopic processes behind the charge-strain response of nanoporous metals in an electrochemical environment are still unclear, it seems to be clear—in a continuum description—that the effect is caused by charge-induced changes in the surface stress ($f$) at the metal-electrolyte interface.

Therefore, in some embodiments, an actuator may be based on surface-chemistry induced changes of the surface stress at a solid-gas interface which, in turn, drives an elastic macroscopic sample contraction and/or expansion. This actuator can be used to directly convert chemical energy into a mechanical response without generating heat or electricity first. While not wishing to be bound by any particular theory, covalent adsorbate-metal interactions seem to play a decisive role in determining both size and even sign of adsorbate-induced changes of $f$. Although the relative change in $f$ may be large, a macroscopic strain response typically requires the use of high-surface-area material.

It is believed that surface chemistry driven actuation, as disclosed herein, will develop into an economically viable technology, as various embodiments provide low materials costs, high efficiency and long-term stability. The efficiency can be increased by using less energetic reactions than the oxidation of CO by $O_3$ used in the present work. This may include surface engineering to tailor the surface reactivity, for example by Ag doping to increase the catalytic activity of np-Au towards the dissociation of molecular oxygen which is a lower energy fuel. Furthermore, rather than using noble metal based systems such as np-Au, other embodiments use lower-cost, lower-density, and stronger high surface area materials such as carbon aerogels, for example.

Now referring to FIG. 1, an experimental setup is shown that can detect volumetric contraction and expansion of a material. In particularly preferred embodiments, the system includes a porous metal structure 102, which when contacted with a modifying agent which chemically adsorbs to a surface of the porous metal structure, exhibits a volumetric contraction due to modification of an existing surface stress of the porous metal structure.

The porous metal structure may be nanoporous gold, as described herein, or may be any other nanoporous metal. Monolithic samples of nanoporous Au can be obtained by dealloying an Ag—Au alloy which leads to the development of a characteristic three-dimensional open-cell porosity.

In addition to the porous material, the device includes a mechanism for detecting and/or transferring the volumetric contraction or expansion, such as a piston/displacement sensor unit 104 and environmental cell 106 arrangement, as shown in FIG. 1, and/or a mechanical lever, optical sensor, electrical switch, etc.

In a particularly preferred method of controlling macroscopic strain of a porous metal structure, the method comprises contacting a porous material with a modifying agent which chemically adsorbs to a surface of the porous structure and modifies an existing surface stress of the porous structure.

In another method of controlling macroscopic strain of a porous structure, the method comprises contacting a porous structure with a removing agent for removing a chemically adsorbed modifying agent from the porous structure, thereby causing a volumetric recovery of the porous structure.

In yet another method of controlling macroscopic strain of a porous structure, the method comprises contacting a porous structure with a modifying agent which chemically adsorbs to a surface of the porous structure and modifies an existing surface stress of the porous structure, thereby causing an at least partially reversible volumetric change (expansion or contraction) of the nanoporous metal structure; and contacting the porous structure with a removing agent for removing a chemically adsorbed modifying agent from the porous structure, thereby causing an at least partially reversible volumetric recovery of the porous structure The nanoporous structure may be formed from any suitable material. In some embodiments of the device and methods, the nanoporous structure may be formed from a metal such as gold or platinum.

In some embodiments of the device and methods, the nanoporous metal structure may be formed using two or more metals (e.g., as an alloy or composite), or a metal and nonmetal (e.g., carbon).

In some embodiments of the device and methods, these nanoporous metal/metal or metal/nonmetal hybrid materials may be prepared by coating a nanoporous metal with another metal or nonmetal by using atomic layer deposition, electro-deposition, or some other suitable method.

Nanoporous gold (nanoporous Au) may be prepared using methods known in the art. Nanoporous Au can be prepared in the form of millimeter-sized monolithic samples by a process called 'dealloying.' In metallurgy, dealloying is defined as selective corrosion (removal) of the less noble constituent from an alloy, usually via dissolving this component in a corrosive environment. For example, nanoporous Au may be formed by selectively leaching silver (Ag) from an Ag—Au alloy using either a strong oxidizing acid such as nitric acid (free corrosion) or by applying an electrochemical driving force (electrochemically-driven dealloying). Both methods lead to the development of nanoporous open-cell morphology.

In the case of silver-gold (Ag—Au) alloys, this technique leads to the development of a three-dimensional bicontinuous nanoporous structure while maintaining the original shape of the alloy sample. Chemical analysis of the material reveals that almost pure Au may be achieved using this process.

In various embodiments of the device and methods, the porous metal structure may comprise at least one metal selected from a group consisting of Group 8 elements, Group 9 elements, Group 10 elements, and Group 11 elements, using International Union of Pure and Applied Chemistry (IUPAC) nomenclature. Accordingly, the porous metal structure may be formed of a substantially pure metal, a metal alloy having one component selected from the list, a metal alloy having two or more components selected from the list, etc. Particularly preferred metals from the aforementioned group include Ni, Cu, Ru, Rh, Pd, Ag, Ir, Pt, and Au.

In particularly preferred embodiments of the device and methods, the porous metal structure may be a nanoporous structure comprising gold or platinum, possibly formed with the techniques described herein, or other technique.

In some embodiments of the device and methods, the porous metal structure may have a ratio of surface atoms to bulk atoms of at least about $1\times10^{-3}$. Of course, the porous metal structure may have a ratio of surface atoms to bulk atoms of more or less than this figure.

In additional embodiments of the device and methods, a media pore size of the porous metal structure may be less than about 100 nanometers (nm), less than about 80 nm, less than about 60 nm, etc. Of course, the porous metal structure may have a median pore size of more or less than this figure.

In other embodiments, the modifying agent may be any liquid or gas which can adsorb into the nanoporous metal structure and by being adsorbed modifies the existing surface stress of the porous structure. For example, the existing surface stress of the porous structure can be modified by modifying the metal-metal bonding in the surface layer of the nanoporous metal structure, for example by charge transfer. Modifying agents include, but are not limited to, nitrogen, oxygen, fluorine, bromine, hydrogen, chlorine, hydrocarbons, etc.

In still other embodiments of the device and methods, the modifying agent may be selected from a group consisting of hydrogen, a hydrocarbon, nitrogen, oxygen, fluorine, sulfur, chlorine, and bromine. Of course, the contacting of the modifying agent with the porous metal structure may be effected by exposing the porous metal structure to the pure modifying agent, a mixture containing the modifying agent, etc.

In particularly preferred embodiments of the methods, the modifying agent may be oxygen, the modifying agent being contacted with the porous metal structure by exposure of the porous metal structure to ozone. This technique of exposing the porous metal structure to a modifying agent is similar to the techniques described herein.

In other embodiments of the methods, the porous metal structure may be contacted with the modifying agent for a time sufficient to generate a linear dimensional changes (contraction or expansion) of the porous metal structure of at least about 0.01%. In other approaches, at least about 0.05%, at least about 0.1%, at least about 0.5%, about 1.0%, or any value between 0 and about 1% (or higher) may be achieved. The particular amount of expansion achievable is at least partially dependent upon the metal, the nanoporous structure, and modifying agent used. The linear dimensional change may be measured between opposite sides or ends of the porous metal structure.

In still other embodiments of the methods, the modifying agent, upon chemical adsorption to the porous metal structure, may cause an at least partially reversible volumetric change (expansion or contraction) of the nanoporous metal structure, as measured from outer dimensions of the structure, e.g., length, height, width, etc. By stating that the volumetric change is at least partially reversible, it is intended that the porous metal structure may substantially return to its former volume prior to being exposed to the modifying agent, with some irreversible shrinkage being allowed.

In other embodiments of the methods, the removing agent may be carbon monoxide, hydrogen, or any other liquid or gas that can remove the modifying agent, preferably without substantially affecting the underlying structure.

Experiments

In this section, in-situ strain measurements on nanoporous gold are reported. By using the oxidation of carbon monoxide by ozone, shown in Equation 1, as a driving reaction, reversible, macroscopic strains of up to 0.5% were achieved.

$$CO+O_3\rightarrow CO_2+O_2 \quad \text{Equation 1}$$

Nanoporous gold (nanoporous Au) is an ideal material for this experiment for several reasons. First, the material is reactive enough to catalyze surface reactions such as ozone dissociation and carbon monoxide oxidation at room temperature, but it is also noble enough to prevent irreversible oxidation. Second, nanoporous Au's characteristic sponge-like open-cell foam morphology makes it a high surface area material which also combines high porosity (mass transport) with high strength (sustainable stress). Finally, ozone exposure can be expected to change the surface stress of Au as oxygen adsorption has been shown to lead to a withdrawal of electrons from the surface atoms (depletion of the Au 5d band).

Preparation of Nanoporous Gold

For the experiments described below, cuboid samples ($1\times1\times1$ $mm^3$) of nanoporous Au where prepared by electrochemical etching of an $Ag_{75}Au_{25}$ alloy in 1-Molar perchloric acid electrolyte in a standard three-electrode electrochemical setup. The resulting Au foam samples had a porosity of about 70%, and exhibited a specific surface area of about 10-15 $m^2/g$ and a pore size of about 10-20 nm. The strain measurements were performed in a commercial dilatometer equipped with a sealed sample compartment for environmental control, similar to the apparatus shown in FIG. 1.

Measurement of the Macroscopic Strain of Nanoporous Gold by Using a Dilatometer

The strain measurements (macroscopic length changes) were performed in a commercial dilatometer 100 equipped with a small glass chamber 106 for environmental control, in a configuration similar to that shown in FIG. 1. Cuboids (1×1×1 $mm^3$) of nanoporous Au 102 were exposed to alternating cycles of ozone in synthetic air (nominally 80% $N_2$, 20% $O_2$) and carbon monoxide at room temperature, and the macroscopic length changes induced by the interaction of nanoporous gold with these gases were monitored in situ 104. The gas flow was adjusted to 10 sccm resulting in an instrumental response time of about 1 min, with the ozone concentration varied between 0% and 7.5%. Initially and between every ozone and carbon monoxide exposure, the experimental setup was purged with nitrogen ($N_2$). The exposure times were varied between a few minutes to a few hours, and the number of cycles varied between 1 and 100.

Figure 2:
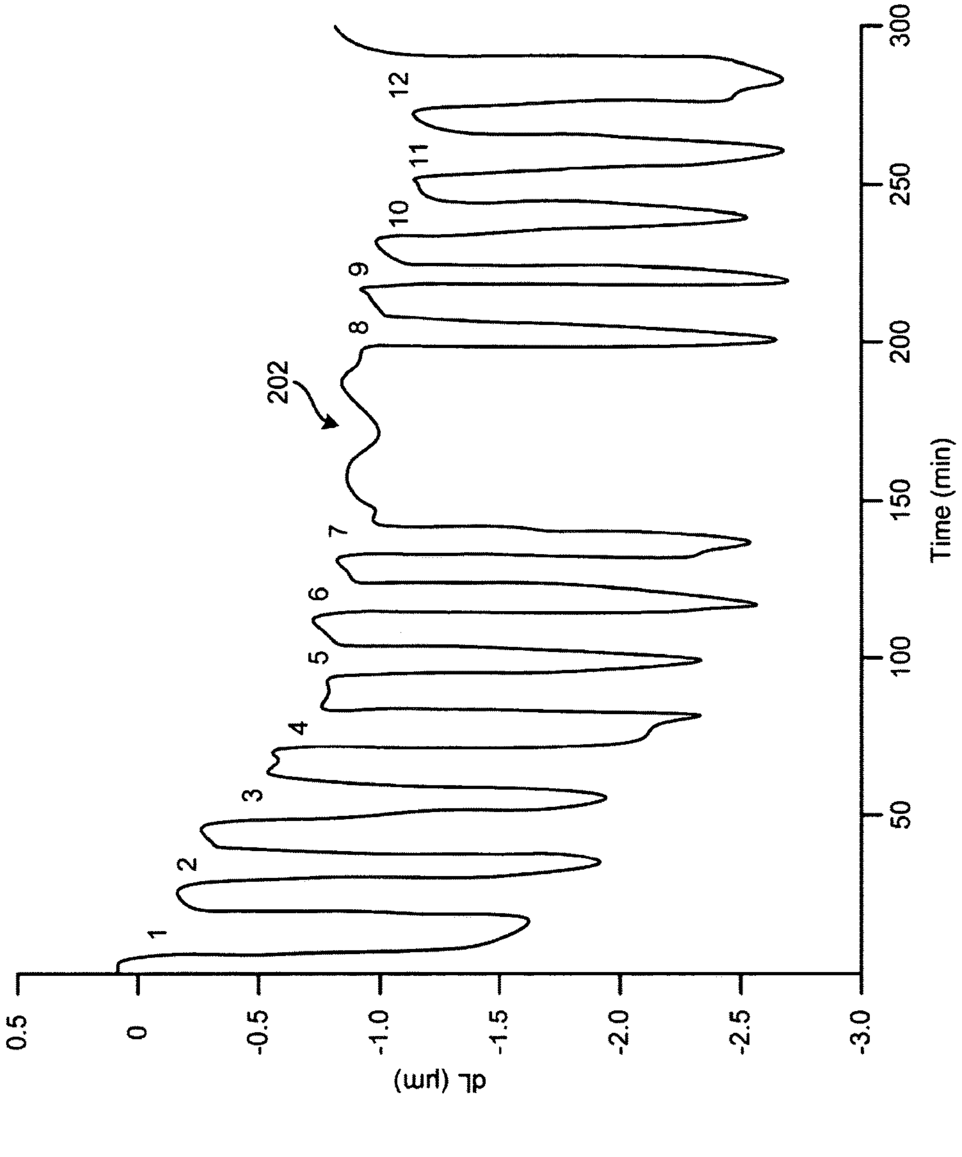
FIG. 2 is a graphical representation of a typical data set measuring change in length (ΔL, μm) versus time (min).
Figure 3:
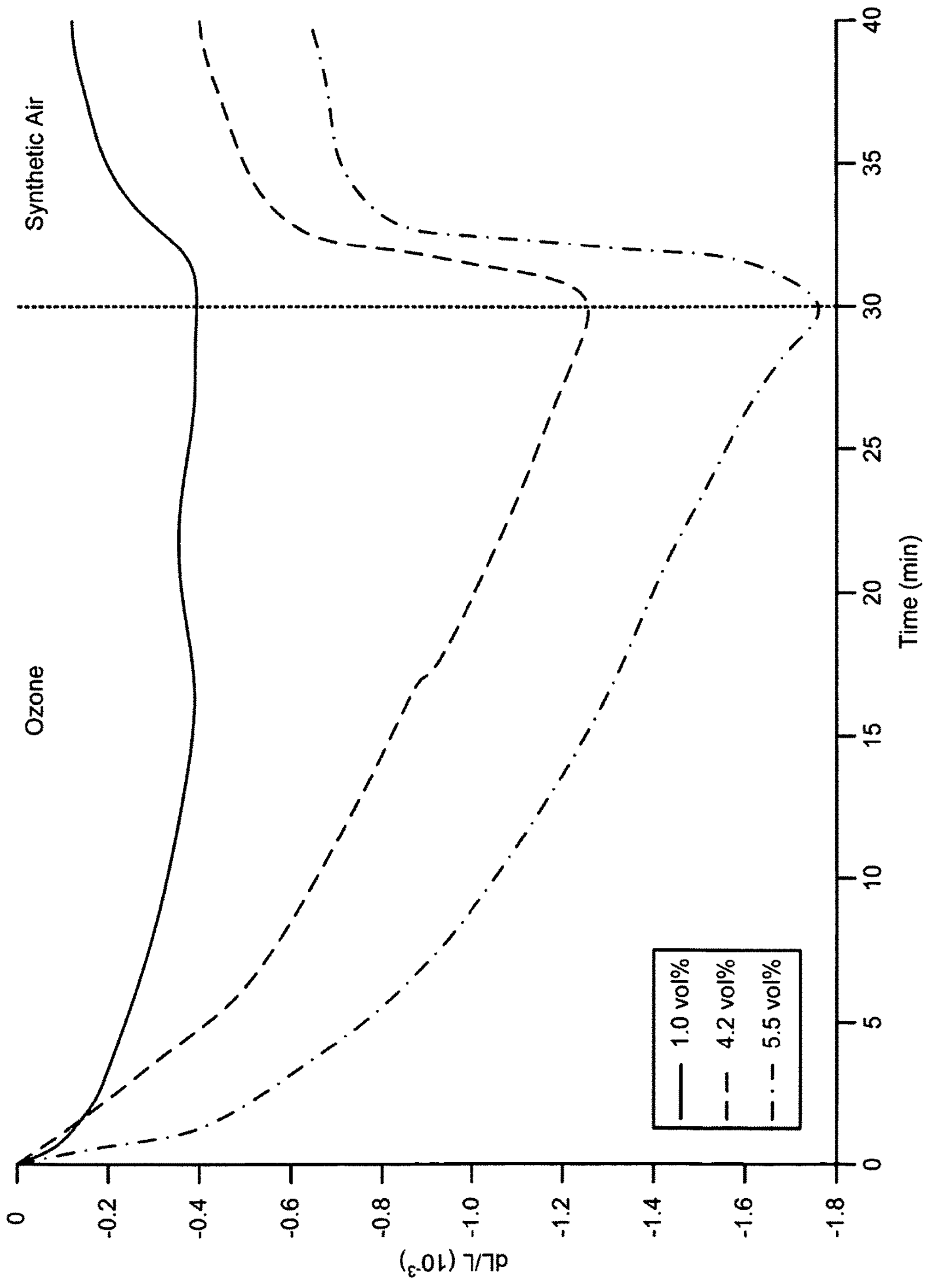
FIG. 3 is a graphical representation of a typical data set measuring strain (ΔL/L) versus time (min) as a function of increasing ozone concentration.

A typical macroscopic strain versus time data set is shown in FIG. 2. In the experiments, the strain was continuously monitored while the samples were alternately exposed to a mixture of 1-8% $O_3$ in $O_2$ and pure CO. Splitting the surface catalyzed oxidation of CO by $O_3$ into two self-limiting half-reactions allows one to switch the surface of nanoporous Au back and forth between an oxygen-covered and clean state. In the first half cycle, ozone exposure leads to oxygen adsorption on the clean Au surface, according to Equation 2.

$$O_3+Au \rightarrow Au—O+O_2 \qquad \text{Equation 2}$$

Meanwhile, CO exposure in the second half cycle restores the clean Au surface by reacting with adsorbed oxygen towards carbon dioxide according to Equation 3.

$$CO+Au—O \rightarrow CO_2+Au \qquad \text{Equation 3}$$

In contrast to oxygen, CO does not form a stable adsorbate layer on Au surfaces at room temperature, and the CO coverage will rapidly approach zero once the CO exposure is interrupted. The data shown in FIG. 2 reveal that $O_3$ exposure (chemisorption of oxygen) causes a sample contraction, while CO exposure restores the original sample dimensions by reacting with adsorbed oxygen. The strain amplitude increases with both cycle length and the 03 concentration, and typical strain values lie in the range from about 0.05% to about 0.5%. Note that a strain amplitude of 0.5% corresponds to a macroscopic actuator stroke of 5 μm for a one-mm-long sample. A small irreversible component is superimposed on the elastic response, which becomes more pronounced for larger actuator strains. This might indicate plastic yielding or, more consistent with the slow kinetics, stress-driven diffusion creep.

Results From Experimental Testing

FIG. 2 shows a typical data set. The sample dimensions (and thus the strain ΔL/L) changes with time as the sample is exposed to alternating cycles of ozone and carbon monoxide. Ozone exposure causes shrinkage, and subsequent carbon monoxide exposure leads to expansion and recovery of the original sample dimension. The length changes are reversible with a small superimposed irreversible shrinkage. In this specific example, an ozone concentration of 7.1% was used, and the exposure time to both ozone and carbon monoxide was 5 minutes interrupted by 3 minutes of nitrogen purging (except between cycle #7 and cycle #8 202 where the sample was purged for 55 minutes with nitrogen). The average length change in FIG. 2 is about 1.7 micron which translates into a strain value of about 0.2%. However, larger ΔL/L values have been observed after prolonged ozone exposure (data not shown).

Without wishing to be bound by any theory, the observations described above can be explained as follows:

1) In an electrochemical environment, on can induce reversible macroscopic dimensional changes in nanoporous gold by applying a potential relative to the electrolyte.
2) Such length changes can be explained by changes of the surface stress via changing the surface electronic charge density
3) Changes of the surface stress can also occur during adsorption of gas phase species. Adsorbate-induced changes of the surface stress can, but do not have to, be caused by adsorbate-induced charge transfer For example, it is believed that oxygen adsorption on Au(111) induces a charge transfer of about 0.7 eV from gold to oxygen (the Pauli electronegativity of gold is 2.54, whereas oxygen has a value of 3.44).
4) Chemisorbed oxygen on Au surfaces can be produced by ozone exposure at room temperature (due to the inertness of Au molecular oxygen does not chemisorb on Au surfaces) according to Equation 2. The oxidation of Au surfaces is accompanied by electron withdrawal from Au surface atoms.
5) Oxidized gold surfaces can be reduced by carbon monoxide exposure at room temperature (carbon dioxide formation), according to Equation 3. The reduction of oxidized gold surfaces is accompanied by electron injection to Au surface atoms. Combining Equations 2 and 3 leads to the following gold catalyzed reaction which is accompanied by charge transfer to and from the gold surface, shown as Equation 1.

Thus the measured macroscopic length changes of nanoporous gold upon alternating exposures to ozone and carbon monoxide can be explained by adsorbate induced changes of the surface stress. It is believed that the adsorbate-induced change of the surface stress is related to charge transfer during chemisorption and subsequent reaction of oxygen.

Although only the uniaxial strain response, ΔL/L of the system, was recorded, it is truly a 3-dimensional phenomenon where in the limit of small strains the volume change ΔV/V is given by 3ΔL/L. Since nanoporous Au can sustain macroscopic stresses of up to about 200 MPa, the actuator concept described here has a PdV work density of about 3 $MJ/m^3$. The advantage of the surface-stress driven actuator concept described here is that maintaining the strain does not require the continuous supply of chemical energy. The efficiency of the actuator can be estimated from the standard Gibbs energy of reaction of the CO oxidation by $O_3$ (about 420 kJ/mol), and the number of surface atoms (about 1000 $mol/m^3$ for nanoporous Au with a specific surface area of about 10 $m^2/g$ and density of $6\times10^6$ $g/m^3$). Using the oxygen saturation coverage of approximately one monolayer (about $10^{15}$ $cm^{-2}$) obtained from the CO titration experiment on nanoporous Au reveals an efficiency in the order of about 1.0%. The low efficiency is a direct consequence of the strongly exothermic nature of the driving reaction. In principle, it should be possible to increase the efficiency by selecting reactions which are accompanied by small entropy and enthalpy changes. Note that the one-mm-cube samples used in the current study contain only about $10^{-6}$ mol of surface atoms, thus making it a potentially very sensitive sensor material. For example, a miniaturized 10-micron cube could still produce an easy to detect 50-nm stroke which would translate into a detection limit of ozone as low as $10^{-12}$ mol. Similar results are believed to be obtainable for other modifying agents.

The surface stress changes necessary to explain the observed macroscopic dimensional changes can be analyzed within a continuum approach. The starting point for such an analysis is the generalized capillary equation for solids which relates the volumetric average of the pressure in the solid to the area average of the surface stress. Assuming that the measured dimensional change $\Delta L/L_o$ is the direct consequence of a surface-stress induced, linear elastic and isotropic lattice strain, one can show that the mean change of surface stress <Δf> is related to $\Delta L/L_o$ via Equation 4.

$$\langle \Delta f \rangle = -\frac{9K}{2\alpha_{mP}} * \frac{\Delta L}{L_o} \quad \text{Equation 4}$$

where K is the bulk modulus of the solid (220 GPa for Au), $\alpha_{in}$ is the specific surface area (10-15 $m^2/g$), and p is the bulk density ($19.3\times10^6$ $g/m^3$ for Au). According to Equation 4, <Δf> of 17-26 N/m would be required to explain a compressive strain of 0.005. It can be shown that Equation 4 overestimates the magnitude of <Δf> by (in extreme cases) as much as one order of magnitude, in particular for materials with a large Poisson number such as Au.

Molecular dynamics (MD) simulations offer just such an opportunity to independently test the surface stress-strain response of nanoporous Au. In these experiments, fully atomistic MD simulations were performed on the effect of surface stress on the equilibrium shape of realistic models of nanoporous Au and its structural building blocks, the ligaments. The embedded atom method (EAM) potential used in this work generates a tensile surface stress of about 1.3 N/m (at 0K) for the Au(100) surface. The skeletal network of the computational nanoporous Au samples was generated by simulating the spinodal decomposition during vapor quenching, and freezing the process once the desired length scale was achieved. The final structure was obtained by adjusting the ligament diameter to produce the desired porosity (about 70%), and filling the ligament volume with Au atoms. (100)-oriented Au nanowires were used as models for the ligaments. Both samples were created using the atomic positions of bulk fcc Au. The effect of tensile surface stress was studied by equilibrating the samples to zero overall pressure at various temperatures ranging from 0K to 300K. The dimensional changes observed during this relaxation are caused solely by tensile surface stress, and therefore provide a benchmark for the thermodynamic surface stress-strain correlation. The results of this experiment revealed that Equation 4 indeed underestimates the effect of surface stress. In the case of nanowires, the effect of tensile surface stress is an almost uniaxial contraction along the wire axis (ΔL/L is about ΔV/V) and the contraction is approximately seven times larger than predicted by Equation 4. The nanoporous samples, on the other hand, show isotropic contraction (ΔL/L is about ⅓ ΔV/V), and the relaxation is weaker, but still three times stronger than predicted by the thermodynamic approach. The differences between nanowires and nanoporous Au is consistent with the random network structure of the latter, and their lower surface-to-volume ratio. Besides the presence of local shear deformation, the stronger-than-predicted MD strain response may also reflect the extremely high fraction of step edge and kink site atoms (coordination number 7 and 6, respectively) of these samples. In view of the MD results, the experimentally observed strain levels of tip to 0.005 can be explained by surface stress changes of about 6 N/m instead of the about 20 N/m predicted by the thermodynamic approach.

So far, only the size of the adsorbate-induced surface stress changes have been discussed, but not their sign. Sample contraction (negative strain) as observed upon $O_3$-exposure in the present case (FIG. 2) requires generation of tensile surface stress. Unfortunately, there are still many open questions regarding the atomistic and electronic origin of adsorbate-induced changes of surface stress. Qualitatively, however, the behavior can be understood in terms of a strengthening of the in-plane metal-metal bonds, e.g., by depopulation of antibonding metal states via charge transfer from the metal to the adsorbate. For the Au/O system, the accumulation of negative charge on oxygen in the Au/O system is consistent with the higher Pauling electronegativity of oxygen (3.44) with respect to gold (2.54), and has indeed been found in density functional theory (DFT) calculations. Note, however, that also the opposite effect has been observed. In electrochemical experiments, expansion of nanoporous Au upon charge depletion in the surface layer was detected, in particular when the potential cycling includes strong OH adsorption/desorption. Such differences may be the result of deviating mechanisms with respect to the stress generation at metal-gas and metal electrolyte interfaces. Whereas charge-induced changes of the surface stress at solidelectrolyte interfaces seem to be dominated by classical electrostatic interaction of surface atoms with the surface excess charge, adsorption on transition metal surfaces typically involves the formation of localized (covalent) bonds whereby directly affecting the metal-metal bonding. Nevertheless, a relief of tensile surface stress upon oxygen adsorption from the gas phase cannot be generally excluded and has indeed been observed for the Pt(111)/O system.

Beyond charge transfer, adsorbate-induced morphology changes may also play an important role, for example by changing the surface-to-volume ratio. Indeed, oxygen induced surface roughening via formation of Au-oxide nanoparticles has recently been observed in the Au(111)/O system. To be consistent with observations, such morphology changes would be required to be reversible. For example, Au atoms released from Au-oxide particles by reaction with CO would be required to heal the defects created by the formation of these Au-oxide particles during $O_3$ exposure. In this context, the small irreversible strain component observed in the experiments might also be the result of irreversible morphology changes caused by oxygen-enhanced mass transport. Clearly, the origin of the oxygen-induced tensile surface stress generation observed in the experiments is not fully understood yet.

Finally, the role of residual Ag which is typically in the order of a few percent for the nanoporous Au samples used in the experiments is discussed. In principle, residual Ag can affect the O/CO surface chemistry in two ways: first, vacancy formation (atomic scale roughening) by chemically induced dealloying of Ag by adsorbed oxygen, and second by increasing the catalytic activity of nanoporous Au. Although the latter effect is important in the context of using nanoporous Au as a low temperature CO oxidation catalyst which requires the activation of molecular oxygen ($O_2$), it is not relevant for the current study as we use the more reactive ozone to generate atomically adsorbed oxygen species.

Nevertheless, CO oxidation experiments were performed on Ag-doped nanoporous Au foam samples using a continuous flow reactor which demonstrated that Ag plays an important role in the activation of molecular oxygen. The effect of vacancies on surface stress induced strain was studied by MD simulations on Au nanowires by randomly removing surface atoms. It was observed that the presence of surface vacancies weakens the surface stress induced strain effect rather than enhancing it. This result implies that morphological changes including the atomic scale roughening discussed in the previous paragraph are not the primary cause of the macroscopic strain effect discussed here.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A device, comprising:

a porous structure, which when contacted with a modifying agent which chemically adsorbs to a surface of the porous structure, exhibits a volumetric change due to modification of an existing surface stress of the porous structure; and a mechanism for detecting the volumetric change, wherein the porous structure has a ratio of surface atoms to bulk atoms of at least about $1\times10^{-3}$;

wherein the porous structure comprises:

a nonmetal; and a metal selected from elemental platinum and a platinum alloy and;

wherein the modifying agent is a gas selected from a group consisting of ozone, a hydrocarbon, fluorine, sulfur, chlorine, and bromine;

wherein a median pore size of the porous structure is less than about 100 nm; and wherein, with respect to at least the modifying agent, the porous structure exhibits a detection limit of about $10^{-12}$ mol.

2. The device of claim 1, wherein surfaces of the porous structure are doped with Ag.

3. The device of claim 1, wherein the nonmetal comprises carbon formed on surfaces of the elemental platinum or the platinum alloy.

4. The device of claim 3, wherein the carbon is present in the form of a carbon aerogel.

5. The device of claim 1, wherein the porous structure further comprises at least one additional metal selected from Ni, Cu, Ru, Rh, Pd, Ag, Ir, and Au.

6. The device of claim 1, wherein a median pore size of the porous structure is about 60 nm.

7. The device of claim 1, wherein surfaces of the porous structure are doped with Ag;

wherein the nonmetal comprises carbon formed on surfaces of the elemental platinum or the platinum alloy;

wherein the carbon is present in the form of a carbon aerogel;

wherein the porous structure further comprises at least one additional metal selected from Ni, Cu, Ru, Rh, Pd, Ag, Ir, and Au; and wherein a median pore size of the porous structure is about 60 nm.

8. A device, comprising:

a porous structure comprising carbon and at least one metal selected from Ni, Cu, Ru, Rh, Pd, Ag, Ir, and Au, which when contacted with a modifying agent which chemically adsorbs to a surface of the porous structure, exhibits a volumetric change due to modification of an existing surface stress of the porous structure, wherein the modification of the existing surface stress is controlled by surface chemistry induced changes in the surface of the porous structure without an externally applied potential, wherein the volumetric change is characterized by a change in a lengthwise dimension of between about 1.0 micron and about 2.0 microns; and a mechanism for detecting the volumetric change, wherein the porous structure has a ratio of surface atoms to bulk atoms of at least about $1\times10^{-3}$;

wherein the porous structure has a detection limit with respect to the modifying agent of about $10^{-12}$ mol;

wherein the modifying agent is a gas selected from a group consisting of ozone, a hydrocarbon, fluorine, sulfur, chlorine, and bromine; and wherein a median pore size of the porous metal structure is less than about 100 nm.

9. The device of claim 8, wherein surfaces of the porous structure are doped with Ag.

10. The device of claim 8, wherein the porous structure comprises a metal and a nonmetal.

11. The device of claim 10, wherein the nonmetal comprises carbon.

12. The device of claim 11, wherein the carbon is a carbon aerogel.

13. The device of claim 8, wherein a median pore size of the porous structure is about 60 nm.

14. The device of claim 8, wherein surfaces of the porous structure are doped with Ag;

wherein the porous structure comprises a metal and a nonmetal;

wherein the nonmetal comprises carbon;

wherein the carbon is a carbon aerogel;

wherein the porous structure further comprises at least one additional metal selected from Ni, Cu, Ru, Rh, Pd, Ag, Ir, and Au; and wherein a median pore size of the porous structure is about 60 nm.

15. A device, comprising:

a porous structure, which when contacted with a modifying agent which chemically adsorbs to a surface of the porous structure, exhibits a volumetric change due to modification of an existing surface stress of the porous structure without generating external heat or applying external electricity; and a mechanism for detecting the volumetric change, wherein the porous structure has a ratio of surface atoms to bulk atoms of at least about $1\times10^{-3}$;

wherein the porous structure comprises:

a metal component including a first metal selected from either gold or a gold alloy and a second metal selected from Ni, Cu, Ru, Rh, Pd, Ag, Ir, and Pt; and a nonmetal component comprising carbon formed on surfaces of the metal component;

wherein the modifying agent is a gas selected from a group consisting of ozone, a hydrocarbon, fluorine, sulfur, chlorine, and bromine;

wherein a median pore size of the porous structure is less than about 100 nm; and wherein, with respect to at least the modifying agent, the porous structure exhibits a detection limit of about $10^{-12}$ mol.

16. The device of claim 15, wherein the carbon is a carbon aerogel.

17. The device of claim 15, wherein a median pore size of the porous structure is about 60 nm.

18. A device, comprising:

a carbon aerogel, which when contacted width a modifying agent which chemically adsorbs to a surface of the carbon aerogel, exhibits a volumetric change due to modification of an existing surface stress of the carbon aerogel without generating external heat or applying external electricity; and a mechanism for detecting the volumetric change, wherein the carbon aerogel has a ratio of surface atoms to bulk atoms of at least about $1\times10^{-3}$;

wherein surfaces of the carbon aerogel are doped with Ag; and wherein the modifying agent is selected from a group consisting of ozone, a hydrocarbon, fluorine, sulfur, chlorine, and bromine.

19. The device of claim 18, wherein a median pore size of the carbon aerogel is about 60 nm.

* * * * *